United States Patent
Biris et al.

(10) Patent No.: US 8,304,302 B2
(45) Date of Patent: Nov. 6, 2012

(54) PHOTOVOLTAIC DEVICE USING SINGLE WALL CARBON NANOTUBES AND METHOD OF FABRICATING THE SAME

(75) Inventors: Alexandru S. Biris, Little Rock, AR (US); Zhongrui Li, Little Rock, AR (US)

(73) Assignee: Board of Trustees of the University of Arkansas, Little Rock, AR (US)

( * ) Notice: Subject to any disclaimer, the term of this patent is extended or adjusted under 35 U.S.C. 154(b) by 138 days.

(21) Appl. No.: 12/752,617

(22) Filed: Apr. 1, 2010

(65) Prior Publication Data

US 2011/0024792 A1  Feb. 3, 2011

Related U.S. Application Data

(60) Provisional application No. 61/211,825, filed on Apr. 3, 2009.

(51) Int. Cl.
*H01L 21/337* (2006.01)

(52) U.S. Cl. . 438/191; 438/235; 438/312; 257/E21.371; 977/742; 977/750; 977/890

(58) Field of Classification Search .......... 438/191, 438/235, 312; 977/742, 750, 890; 257/E21.371
See application file for complete search history.

(56) References Cited

U.S. PATENT DOCUMENTS

| 6,203,864 | B1 * | 3/2001 | Zhang et al. ............. 427/592 |
| 7,732,290 | B2 * | 6/2010 | Tombler et al. .......... 438/302 |
| 2001/0023986 | A1 * | 9/2001 | Mancevski ............... 257/741 |
| 2004/0223900 | A1 * | 11/2004 | Khabashesku et al. .... 423/447.1 |
| 2007/0153353 | A1 | 7/2007 | Gruner |
| 2008/0018232 | A1 | 1/2008 | Zhang et al. |
| 2008/0048364 | A1 * | 2/2008 | Armeniades et al. ...... 264/328.1 |
| 2008/0102017 | A1 * | 5/2008 | Maruyama et al. ......... 423/414 |
| 2008/0277652 | A1 | 11/2008 | Mochizuki et al. |
| 2009/0165854 | A1 * | 7/2009 | Yamazaki et al. ......... 136/258 |

OTHER PUBLICATIONS

Cheng Li et al., A fullerene-single wall carbon nanotube complex for polymer bulk heterojunction photovoltaic cells, Journal of Materials Chemistry, 2007, p. 2406-2411, vol. 17.
Zhongrui Li, et al., SOCl2 enhanced photovoltaic conversion of single wall carbon nanotube/n-silicon heterojunctions, Appl. Phys. Lett., 93, (2008) 243117.
Avouris, P., Carbon Nanotube Electronics and Optoelectronics, MRS Bull., 2004, 29, 430.
Saito, R. et al., Physical Properties of Carbon Nanotubes, Imperial College Press, London, 1998.
White, C. T. et al., Carbon nanotubes as long ballistic conductors, Nature, 1998, 393, 240.
Javey, A. et al., Ballistic carbon nanotube field-effect transistors, Nature 2003, 424, 654.
Ji Ung Lee, Photovoltaic effect in ideal carbon nanotube diodes, Appl. Phys. Lett., 2005, 87, 073101.

(Continued)

*Primary Examiner* — Michelle Mandala
(74) *Attorney, Agent, or Firm* — Morris, Manning & Martin, LLP; Tim Tingkang Xia, Esq.

(57) ABSTRACT

A photovoltaic device and methods for forming the same. In one embodiment, the photovoltaic device has a silicon substrate, and a film comprising a plurality of single wall carbon nanotubes disposed on the silicon substrate, wherein the plurality of single wall carbon nanotubes forms a plurality of heterojunctions with the silicon in the substrate.

20 Claims, 5 Drawing Sheets

OTHER PUBLICATIONS

Pradhan, B. et al., Functionalized carbon nanotubes in donor/acceptor-type photovoltaic devices, Appl. Phys. Lett., 2006, 88, 093106-093108.

Ago, H. et al., Composites of Carbon Nanotubes and Conjugated Polymers for Photovoltaic Devices, AdV. Mater., 1999, 11, 1281-1285.

Kymakis, E. et al., Single-wall carbon nanotube-~/conjugated polymer photovoltaic devices, Appl. Phys. Lett., 2002, 80, 112-114.

Bhattacharyya, S. et al., Photovoltaic Properties of Dye Functionalized Single-Wall Carbon Nanotube/Conjugated Polymer Devices, Chem. Mater., 2004, 16, 4819-4823.

Kymakis, E. et al., Post-fabrication annealing effects in polymer-nanotube photovoltaic cells, Phys. D: Appl. Phys., 2006, 39, 1058-1062.

Miller, A. J. Carbon nanotubes grown on In2O3: Sn glass as large area electrodes for organic photovoltaics, Appl. Phys. Lett., 2007, 90, 023105-023107.

Alvarez, W. E. et al., Characterization of Single-Walled Carbon Nanotubes (SWNTs) Produced by CO Disproportionation on Co—Mo Catalysts, Chem. Mater., 2002, 14, 1853-1858.

Richard, C. et al., Supramolecular Self-Assembly of Lipid Derivatives on Carbon Nanotubes, Science, 2003, 300, 775.

Somani, S. P. et al., Improving photovoltaic response of poly(3-hexylthiophene)In—Si heterojunction by incorporating double walled carbon nanotubes, Appl. Phys. Lett., 2006, 89, 223505.

Wei, J. et al., Double-Walled Carbon Nanotube Solar Cells, Nano Letters, 2007, 7(8), 2317-21.

Shimada, T. et al., Double-wall carbon nanotube field-effect transistors: Ambipolar transport characteristics, Appl. Phys. Lett., 2004, 84, 2412-2414.

Martel, R. et al., Single- and multi-wall carbon nanotube field-effect transistors, Appl. Phys. Lett., 1998, 73, 2447-2449.

Sun, J. L. et al., Photoinduced currents in carbon nanotube/metal heterojunctions, Appl. Phys. Lett., 2006, 88, 131107-131109.

Pasquier, A. D. et al., Conducting and transparent single-wall carbon nanotube electrodes for polymer-fullerence solar cells, Appl. Phys. Lett., 2005, 87, 203511.

Wei, J. Q. et al., Carbon Nanotube Macrobundles for Light Sensing, Small, 2006, 2, 988-993.

Parekh, B. B. et al., Improved conductivity of transparent single-wall carbon nanotube thin films via stable postdeposition functionalization, Appl. Phys. Lett., 2007, 90, 121913.

Sheng, P., Fluctuation-induced tunneling conduction in disordered materials, Phys. Rev. B, 1980, 21, 2180.

Ehinger, K. et al., Non-solitonic conductivity in polyacetylene, Philosophical Mag. B, 1986, 53, 301.

Kaiser, A. B., Electronic transport properties of conducting polymers and carbon nanotubes, Rep. Prog. Phys., 2001, 64, 1.

J. Hone et al., Electrical and thermal transport properties of magnetically aligned single wall carbon nanotube films, Appl. Phys. Lett., 2000, 77, 666.

G. Gruner, Carbon nanotube films for transparent and plastic electronics, J. Mater. Chem., 2006, 16, 3533.

Alan B. Kaiser, Systematic Conductivity Behavior in Conducting Polymers: Effects of Heterogeneous Disorder, Adv. Mater., (Weinheim, Ger.), 2001, 13, 927.

Coutts, T. J. et al., Critical Issues in the Design of Polycrystalline, Thin-film Tandem Solar Cells, Prog. Photovoltaics, 2003, 11, 359.

Stadermann, M. et al., Nanoscale study of conduction through carbon nanotube networks, Phys. Rev. B, 2004, 69, 201402(R).

Bradley, K. et al., Flexible Nanotube Electronics, Nano Lett., 2003, 3, 1353.

Snow, E. S. et al., Random networks of carbon nanotubes as an electronic material, Appl.Phys. Lett., 2003, 82, 2145.

Jao van de Lagemaat et al., Organic solar cells with carbon nanotubes replacing In2O3:Sn as the transparent electrode, Appl. Phys. Lett., 2006, 88, 233503.

Skakalova, V. et al., Effect of Chemical Treatment on Electrical Conductivity, Infrared Absorption, and Raman Spectra of Single-Walled Carbon Nanotubes, Phys. Chem. B, 2005, 109, 7174.

Collins, P. G. et al., Extreme Oxygen Sensitivity of Electronic Properties of Carbon Nanotubes, Science, 2000, 287, 1801.

* cited by examiner

PHOTOVOLTAIC DEVICE USING SINGLE WALL CARBON NANOTUBES AND METHOD OF FABRICATING THE SAME

CROSS-REFERENCE TO RELATED PATENT APPLICATION

This application claims the benefit, pursuant to 35 U.S.C. §119(e), of U.S. provisional patent application Ser. No. 61/211,825, filed Apr. 3, 2009, entitled "Light-Harvesting with Single Wall Carbon Nanotubes/n-Silicon Heterojunctions," by Alexandru S. Biris and Zhongrui Li, which is incorporated herein by reference in its entirety.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

STATEMENT OF FEDERALLY-SPONSORED RESEARCH

The present invention was made with Government support under Grant No. DE-FG 36-06 GO 86072 awarded by U.S. Department of Energy (DOE). The government has certain rights in the invention.

FIELD OF THE INVENTION

The present invention relates generally to the field of photovoltaic device such as a solar cell, in particular, to photovoltaic device using single wall carbon nanotubes and methods of fabricating the same.

BACKGROUND

Carbon nanotubes (CNT) possess unique electrical properties, being ideal candidates for various components in modern electronics. Depending on the crystal structure, CNTs have a dual electrical property: semiconducting and metallic.

Single-walled carbon nanotubes (SWNTs) are one particular type of CNTs, which may be used interchangeably in this specification with "CNTs" in the context that is definite and understood by people skilled in the art. SWNTs possess unique optical properties as a result of their one-dimensional nature. Sharp peaks in the density of states, called van Hove singularities (VHS), arise from a quantization of the electronic wave vector in the 1-D system. The SWNTs have a wide range of direct bandgaps matching the solar spectrum, and show strong photoabsorption from infrared to ultraviolet, and exhibit high carrier mobility and reduced carrier transport scattering. These superior properties of SWNTs have made them potential ideal candidate materials for highly active photovoltaic devices, in which semiconductor heterostructures are widely utilized to harvest light energy in connection with solar cells. The photovoltaic effect can be achieved in ideal carbon nanotube diodes. Individual CNTs can form ideal p-n junction diodes. Under illumination, single wall carbon nanotube (SWNT) diodes demonstrate significant power conversion efficiencies resulting in enhanced properties of an ideal diode.

In organic solar cell applications, CNTs were mainly used as nanoscale fillers into polymer matrix or as transparent electrodes for collecting charge carriers. The high aspect ratios and large surface area of nanotubes could be beneficial to exciton dissociation and charge carrier transport thus improving the power conversion efficiency. The conjugated polymers (e.g., P3HT) produce excitons under illumination, while nanotubes embedded into the polymer matrix only provide more interfacial area for exciton dissociation and charge transport path. However, donor-acceptor type structures consisting of conjugated polymers mixed with nanotubes still suffer low conversion efficiency. Further, phase segregation between nanotubes and polymers, aggregation of nanotubes at higher concentration, and coexistence of metallic and semiconducting nanotubes are major limiting factors to the device fabrication and performance. Additionally, nanotube films used as transparent electrodes have shown negligible improvement of efficiency compared with indium tin oxide (ITO) glass.

Therefore, a heretofore unaddressed need exists in the art to address the aforementioned deficiencies and inadequacies.

SUMMARY OF THE INVENTION

In one aspect, the present invention provides a photovoltaic device. In one embodiment, the photovoltaic device has a silicon substrate, and a film comprising a plurality of single wall carbon nanotubes disposed on the silicon substrate, wherein the plurality of single wall carbon nanotubes forms a plurality of heterojunctions with the silicon in the substrate. The plurality of single wall carbon nanotubes forms a randomly distributed porous network.

In one embodiment, the film of single wall carbon nanotubes has a thickness in the range between about 20 nm and 300 nm. The film of single wall carbon nanotubes has an optical transmittance in the range between about 45% and 90% for 550 nm wavelength light. In one embodiment, the film of single wall carbon nanotubes has an optical transmittance of about 60% for 550 nm wavelength light.

In one embodiment, the film of single wall carbon nanotubes is chemically doped with thionyl chloride ($SOCl_2$).

In one embodiment, the substrate comprises n-type silicon.

In another embodiment, the substrate comprises p-type silicon.

In yet another embodiment, the substrate comprises single crystalline silicon.

In a further embodiment, the substrate comprises polycrystalline silicon in thin-film form.

In another aspect, the present invention provides a method of forming a heterojunction structure. In one embodiment, the method includes the steps of:

preparing a silicon substrate; and depositing a film on the silicon substrate, the film comprising a plurality of single wall carbon nanotubes, whereby forming a plurality of heterojunctions between the single wall carbon nanotubes and silicon.

In one embodiment, the step of depositing comprises the steps of preparing a solution of single wall carbon nanotubes dissolved in a solvent; and spraying the solution of single wall carbon nanotubes on the silicon substrate using a carrier gas.

In one embodiment, the carrier gas is dry air.

In one embodiment, the solvent is dimethylformamide (DMF). The method further has the step of heating the silicon substrate and the film to an elevated temperature following the step of spraying to evaporate the solvent. In one embodiment, the heating temperature is about 150° C. In one embodiment, the method further has the step of spraying the solution of single wall carbon nanotubes on the silicon substrate using a carrier gas at least one more time following the step of spraying to change, or control, the thickness of the film.

The depositing step can also be performed by an electrodeposition, an electrospray, a dropping, a casting, or an air-spraying such as the dry-air spraying disclosed herein.

In one embodiment, the method further includes the step of treating the film of single wall carbon nanotubes with thionyl chloride ($SOCl_2$). The step of treating comprises the step of applying droplets of $SOCl_2$ onto the film of single wall carbon nanotubes.

In yet another aspect, the present invention provides an article of manufacture made by the method set forth immediately above.

These and other aspects of the present invention will become apparent from the following description of the preferred embodiment taken in conjunction with the following drawings and their captions, although variations and modifications therein may be affected without departing from the spirit and scope of the novel concepts of the disclosure.

DETAILED DESCRIPTION

Figure 1:
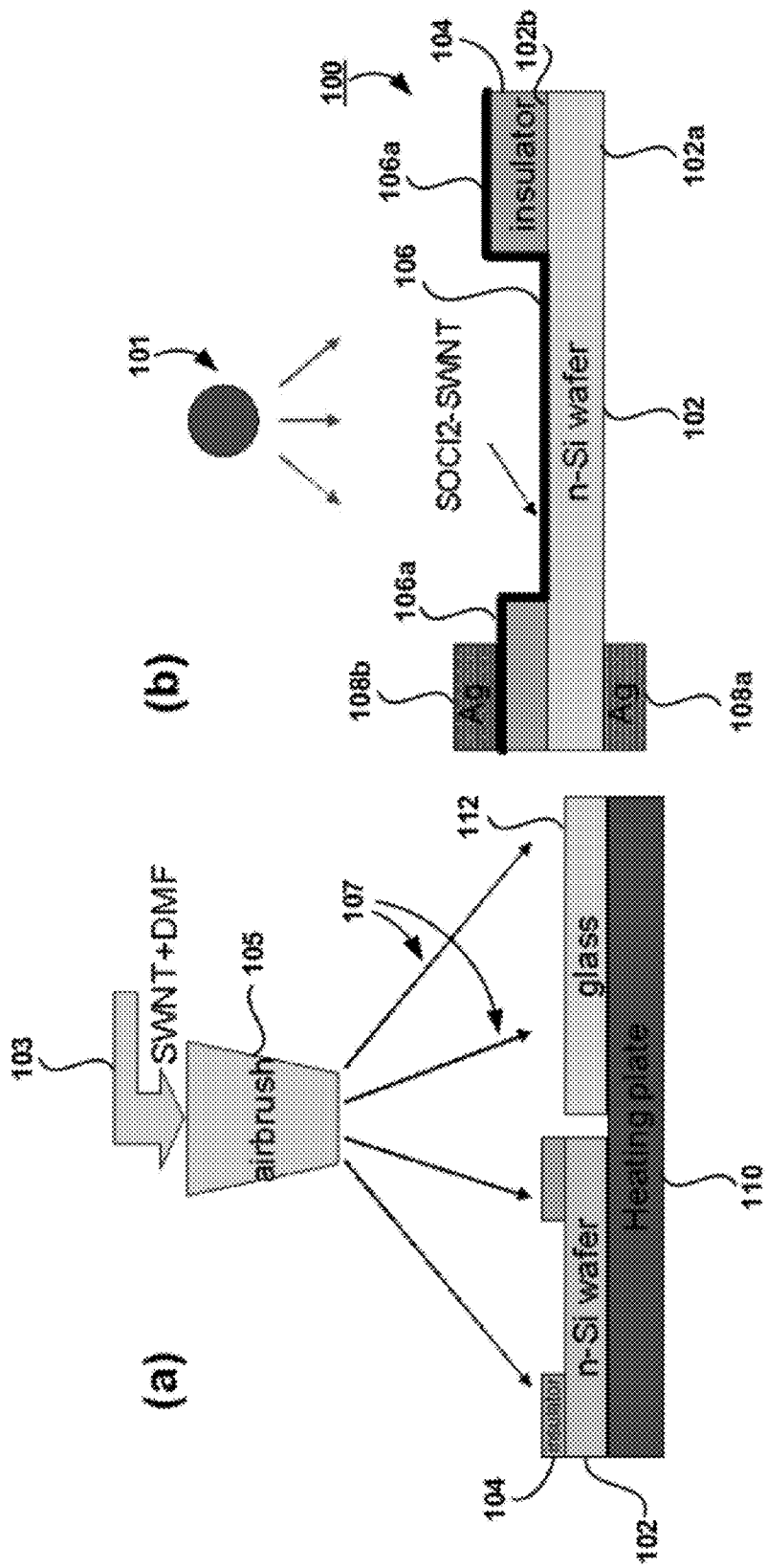
FIG. 1 schematically shows: (a) an air brushing fabrication process of SWNT/n-Si solar cell according to one embodiment of the present invention, where in the SWNT-DMF solution was uniformly airbrushed onto a n-Si substrate and glass reference; and (b) an SWNT/n-Si solar cell formed according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, FIGS. 1-4, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

Definitions

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, if any, the term "Raman spectroscopy" or "Raman techniue" refers to an optical technique that probes the specific molecular content of a sample by collecting in-elastically scattered light. As photons propagate through a medium, they undergo both absorptive and scattering events. In absorption, the energy of the photons is completely transferred to the material, allowing either heat transfer (internal conversion) or re-emission phenomena such as fluorescence and phosphorescence to occur. Scattering, however, is normally an in-elastic process, in which the incident photons retain their energy. In Raman scattering, the photons either donate or acquire energy from the medium, on a molecular level. In contrast to fluorescence, where the energy transfers are on the order of the electronic bandgaps, the energy transfers associated with Raman scattering are on the order of the vibrational modes of the molecule. These vibrational modes are molecularly specific, giving every molecule a unique Raman spectral signature.

Raman scattering is a very weak phenomena, and therefore practical measurement of Raman spectra of a medium requires high power excitation laser sources and extremely sensitive detection hardware. Even with these components, the Raman spectra from tissue are masked by the relatively intense tissue auto-fluorescence. After detection, post processing techniques are required to subtract the fluorescent background and enable accurate visualization of the Raman spectra. Raman spectra are plotted as a function of frequency shift in units of wavenumber ($cm^{-1}$). The region of the Raman spectra where most biological molecules have Raman peaks is from 500 to 2000 $cm^{-1}$. In contrast to fluorescence spectra, Raman spectra have sharp spectral features that enable easier identification of the constituent sources of spectral peaks in a complex sample.

As used herein, the term "ITO" or "ITO glass" refers to indium tin oxide, or tin-doped indium oxide, which is a solid solution of indium(III) oxide ($In_2O_3$) and tin(IV) oxide ($SnO_2$), typically 90% $In_2O_3$, 10% $SnO_2$ by weight. It is transparent and colorless in thin layers while in bulk form it is yellowish to grey. In the infrared region of the spectrum it is a metal-like mirror. Indium tin oxide is one of the most widely used transparent conducting oxides and so has main feature of a combination of electrical conductivity and optical transparency. Thin films of indium tin oxide are most commonly deposited on surfaces by electron beam evaporation, physical vapor deposition, or a range of sputter deposition techniques.

As used herein, "nanoscopic-scale," "nanoscopic," "nanometer-scale," "nanoscale," "nanocomposites," "nanoparticles," the "nano-" prefix, and the like generally refers to elements or articles having widths or diameters of less than about 1 µm, preferably less than about 100 nm in some cases. In all embodiments, specified widths can be smallest width (i.e. a width as specified where, at that location, the article can have a larger width in a different dimension), or largest width (i.e. where, at that location, the article's width is no wider than as specified, but can have a length that is greater).

As used herein, "carbon nanostructures" refer to carbon fibers or carbon nanotubes that have a diameter of 1 µm or smaller which is finer than that of carbon fibers. However, there is no particularly definite boundary between carbon fibers and carbon nanotubes. By a narrow definition, the material whose carbon faces with hexagon meshes are almost parallel to the axis of the corresponding carbon tube is called a carbon nanotube, and even a variant of the carbon nanotube, around which amorphous carbon exists, is included in the carbon nanotube.

As used herein, "plurality" means two or more.

As used herein, the terms "comprising," "including," "carrying," "having," "containing," "involving," and the like are to be understood to be open-ended, i.e., to mean including but not limited to.

OVERVIEW OF THE INVENTION

The present invention provides, among other things, an innovative yet simple way to fabricate semiconductor/nanotube hybrid devices, which may open the access to new technologies. In one aspect, SWNT/n-Si junctions formed according to one embodiment of the present invention can be applied as either diode components for high-frequency communication or photovoltaic devices for renewable energy technologies.

The solar cells are based on high-density p-n heterojunctions between single wall carbon nanotubes (SWNTs) and n-type crystalline silicon, and produced with airbrushing technique. The SWNT/n-Si heterojunction is rectifying. Under optical excitation the numerous heterojunctions formed between the semitransparent SWNTs thin coating and the n-type silicon substrate generate electron-hole pairs, which are then split and transported through SWNTs (holes) and n-Si (electrons), respectively. The nanotubes serve as both photogeneration sites and a charge carriers collecting/transport layer. It was also found that the $SOCl_2$-treatment of SWNT coating films can lead to a significant increase in the conversion efficiency through re-adjusting the Fermi level and increasing the carrier concentration and mobility of the nanotube network. Initial tests have shown a power conversion efficiency of above 4%, proving that $SOCl_2$ treated-SWNT/n-Si is a potentially suitable configuration for making solar cells. High dense SWNT/n-Si heterojunctions prepared with airbrushing technique according to one embodiment of the present invention show a strong rectifying behavior and photovoltaic effects when optically excited. Carbon nanotubes can be directly used as the energy conversion materials in solar cells, serving for both the photogeneration process and charge carrier transport. The numerous heterojunctions formed between p-SWNTs and n-Si perform just as the conventional p-n junctions in the generation of electron-hole pairs, which are then split and transported through SWNTs (holes) and n-Si (electrons), respectively. After the $SOCl_2$ treatment the major conduction mechanism of the SWNT coating network shifted from hopping towards tunneling. The $SOCl_2$-treatment of SWNT films also lead to significant increase in the conversion efficiency by adjusting the Fermi level and enhancing the carrier mobility of the SWNT coating. The larger carrier density and higher mobility of $SOCl_2$ treated-SWNTs ensure more enhanced current density and power efficiency of solar cells compared with extensively studied polymer-nanotube composite structures. While most results disclosed herein are based on Si substrate, it is understood that people skilled art can apply the process/methods of the present invention to substrates that are made from other semiconductors or flexible thin-films.

Thus, in one aspect, the present invention provides a photovoltaic device. In one embodiment as shown in FIG. 1, photovoltaic device 100 has a silicon substrate 102, and a film 106 having a plurality of single wall carbon nanotubes disposed on the silicon substrate 102, where the plurality of single wall carbon nanotubes forms a plurality of heterojunctions with the silicon in the substrate 102. The plurality of single wall carbon nanotubes forms a randomly distributed porous network.

In one embodiment, the film 106 of single wall carbon nanotubes has a thickness in the range between about 20 nm and 300 nm. The film of single wall carbon nanotubes has an optical transmittance in the range between about 45% and 90% for 550 nm wavelength light. In one embodiment, the film of single wall carbon nanotubes has an optical transmittance of about 60% for 550 nm wavelength light.

In one embodiment, the film of single wall carbon nanotubes is chemically doped with thionyl chloride ($SOCl_2$).

In one embodiment, the substrate is a n-type silicon substrate.

In another embodiment, the substrate is a p-type silicon substrate.

In yet another embodiment, the substrate is a single crystalline silicon substrate.

In a further embodiment, the substrate has polycrystalline silicon in thin-film form.

In another aspect, the present invention provides a method of forming a heterojunction structure. In one embodiment, the method includes the steps of:

preparing a silicon substrate; and depositing a film on the silicon substrate, the film comprising a plurality of single wall carbon nanotubes, whereby forming a plurality of heterojunctions between the single wall carbon nanotubes and silicon.

In one embodiment, the step of depositing comprises the steps of preparing a solution of single wall carbon nanotubes dissolved in a solvent; and spraying the solution of single wall carbon nanotubes on the silicon substrate using a carrier gas.

In one embodiment, the carrier gas is dry air.

In one embodiment, the solvent is dimethylformamide (DMF). The method further has the step of heating the silicon substrate and the film to an elevated temperature following the step of spraying to evaporate the solvent. In one embodiment, the heating temperature is about 150° C. In one embodiment, the method further has the step of spraying the solution of single wall carbon nanotubes on the silicon substrate using a carrier gas at least one more time following the step of spraying to change, or control, the thickness of the film.

The depositing step can also be performed by an electrodeposition, an electrospray, a dropping, a casting, or an air-spraying such as the dry-air spraying disclosed herein.

In one embodiment, the method further includes the step of treating the film of single wall carbon nanotubes with thionyl chloride ($SOCl_2$). The step of treating comprises the step of applying droplets of $SOCl_2$ onto the film of single wall carbon nanotubes.

In one embodiment, the plurality of single wall carbon nanotubes forms a randomly distributed porous network. The film of single wall carbon nanotubes has a thickness in the range between about 20 nm and 300 nm. The film of single wall carbon nanotubes has an optical transmittance in the range between about 45% and 90% for 550 nm wavelength light. In one embodiment, the film of single wall carbon nanotubes has an optical transmittance of about 60% for 550 nm wavelength light.

In yet another aspect, the present invention provides an article of manufacture such as a photovoltaic device or solar cell made by the method set forth immediately above.

Additional details are set forth below.

EXAMPLES

Aspects of the present teachings may be further understood in light of the following examples, which should not be construed as limiting the scope of the present teachings in any way.

Example 1

Fabrication of SWNT/n-Si hereojunctions. In one embodiment of the present invention, small diameter SWNTs were synthesized from CO proportionation over Co-Mo/$SiO_2$ catalyst. SWNTs consist of seamlessly rolled-up graphene sheets of carbon with π-conjugative and highly hydrophobic sidewalls but can interact with, for example, surfactants and some kinds of aromatic compounds through hydrophobic or π-π electronic interaction(s). Therefore, the SWNTs can be made into uniform solutions with proper treatment. As schematically shown in FIGS. 1(a) and 1(b), the purified SWNTs were first dissolved in dimethylformamide (DMF, 0.5 mg/mL) with the assistance of sonication to form a uniform solution 103, and the uniform solution 103 was directly sprayed on silicon wafer 102 and glass substrate 112 (for reference), respectively, by means of an airbrush 105 using dry air as carrier gas at 2 bars, where dry air and the uniform solution form one or more streams 107 that were spread onto silicon wafers 102 and glass substrates 112 to form a film of SWNTs 106. The silicon wafer 102 with a window of predeposited insulating layer 104 and the glass substrate 112 were also positioned on a heating plate 110 side by side (so that the resulting SWNT network films on Si and glass substrates have the same thickness) and then heated up to 150° C. by the heating plate 110 in order to evaporate the DMF solvent from the film 106.

FIG. 1(b) schematically shows a photovoltaic device 100 that is formed according to the process disclosed above. As formed, photovoltaic device 100 has a silicon substrate 102, which is a n-type silicon substrate in this embodiment. Substrates made from other materials such as p-type silicon, single crystalline silicon, polycrystalline silicon in thin-film form, and a combination of them, may also be utilized to practice the present invention. The silicon substrate 102 has a first surface 102a, and an opposite, second surface 102.

Photovoltaic device 100 has a film 106 that has a plurality of single wall carbon nanotubes disposed on the second surface 102b of the silicon substrate 102, where the plurality of single wall carbon nanotubes forms a plurality of heterojunctions with the silicon in the substrate 102. There are one or more insulator windows 104 formed on some parts of the second surface 102b of the silicon substrate 102. Thus, as formed, photovoltaic device 100 has the film 106 that in part is directly disposed on the second surface 102b of the silicon substrate 102, and in part, parts 106a and 106b, is disposed on the insulator 104. Moreover, a first electrode 108a is formed on the first surface 102a of the silicon substrate 102, and a second electrode 108b is formed on the part 106b of the film over the insulator 104 in a position corresponding to the position of the first electrode 108a. Photovoltaic device 100 can be subjected to a light source 101 such as the Sun to operate for converting light energy absorbed from the sunlight to electric current.

Example 2

Materials and Devices Characterization. The temperature dependent conductivity measurements were performed for the reference SWNT films. Electrical resistivity data as a function of temperature was obtained using a Keithley 2000 digital multimeter connected to a four-probe collinear arrangement on the thin film square samples 0.5×0.5 $cm^2$ with parallel silver contacts. For all the samples the contacts showed a good Ohmic behavior. The observed temperature gradient across the sample was typically 1-2 K and monitored by the silicon diode thermosensor. The Hall Effect measurements were performed under magnetic field of 0.2 T by using standard van der Pauw geometry. To perform the photovoltaic testing, the devices were irradiated under a small-area class-B solar simulator (PV Measurements, Inc.) at AM1.5 (~100 mW/cm2), and data were recorded using a Keithley 2400.

Example 3

Figure 2A:
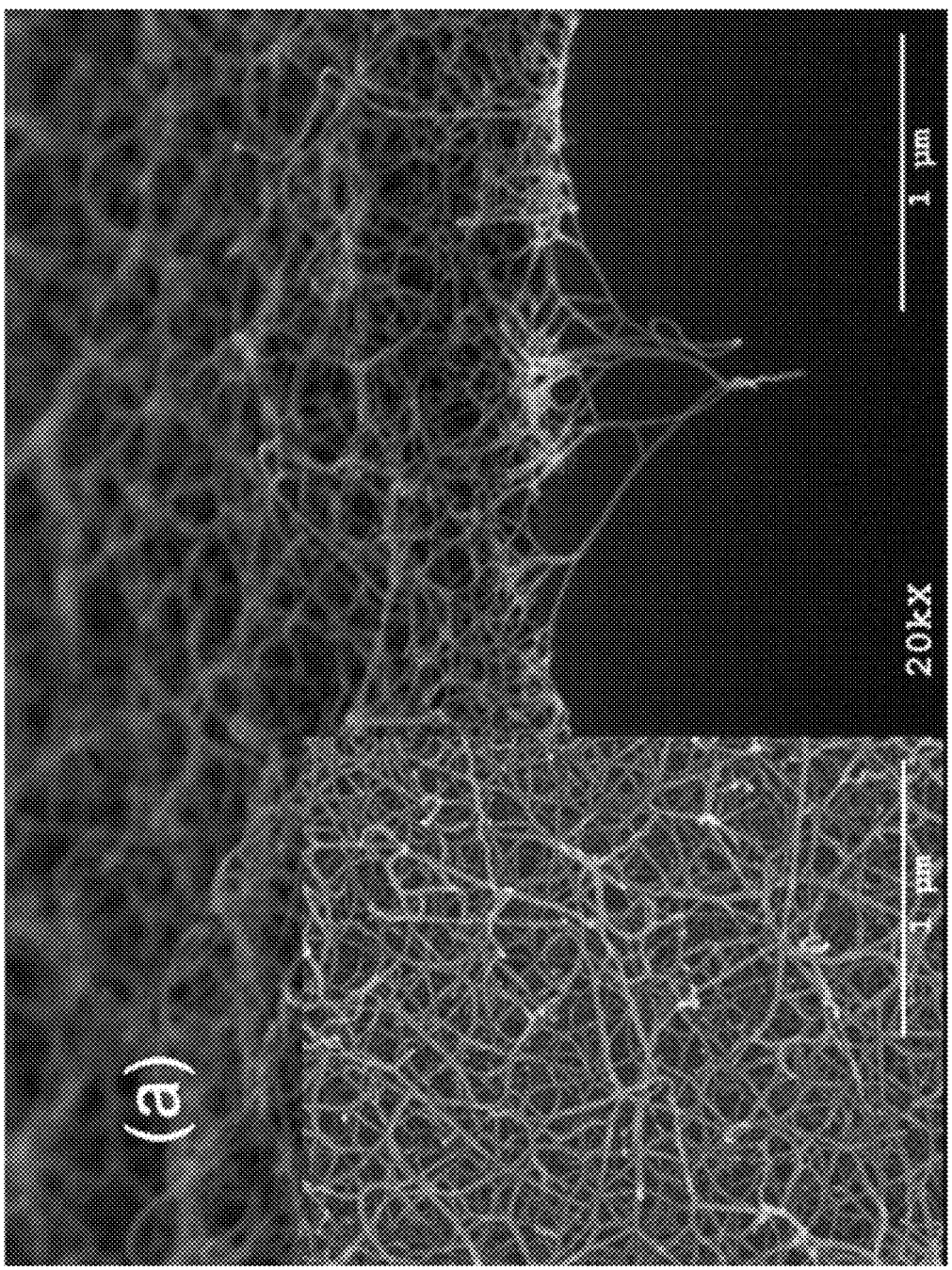
FIG. 2 shows: (a) an SEM image of an SWNT film, made according to one embodiment of the present invention, showing porous network structure, wherein SWNT bundles in close contact to the Si surface, the inset is the top view; and (b) optical transmission property of SWNT film on glass plate. Inset: Optoelectronic performance of SWNT films at wavelength of 550 nm.
Figure 2B:
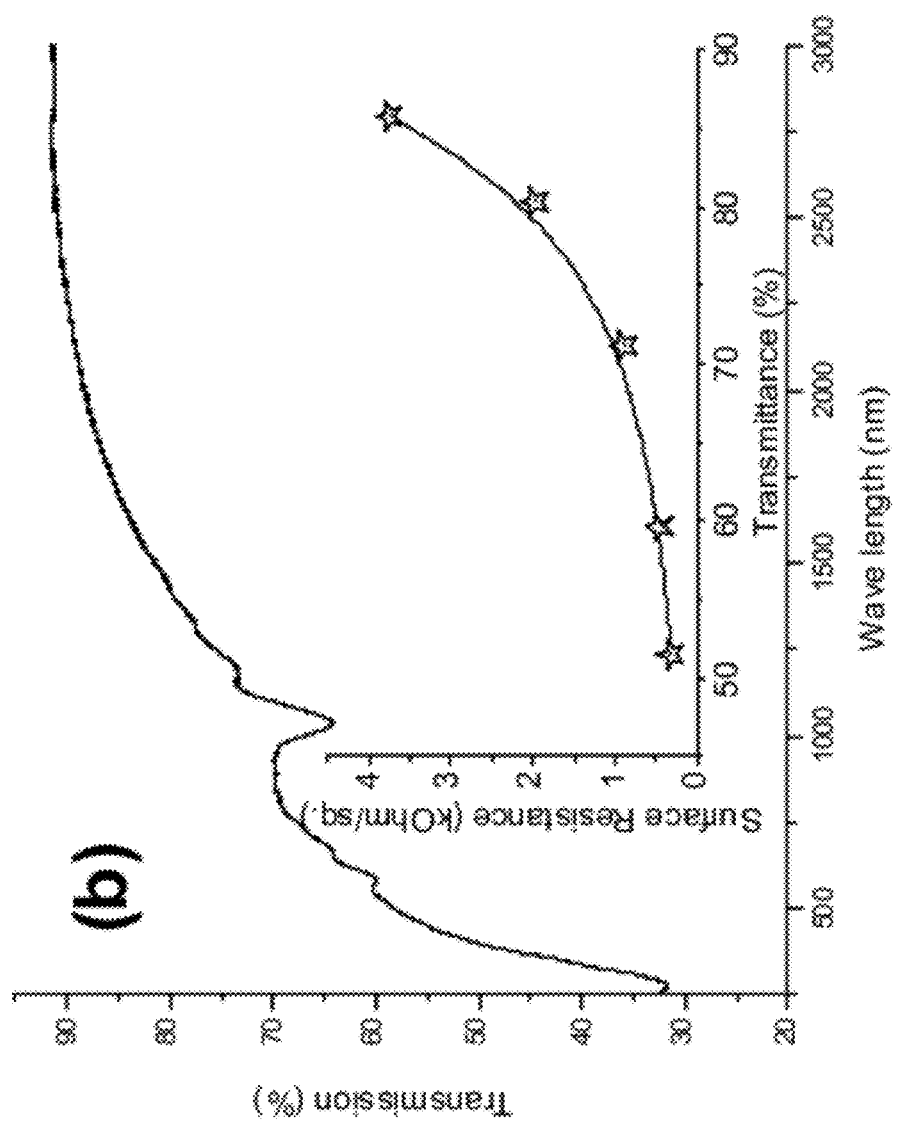
Figure 3:
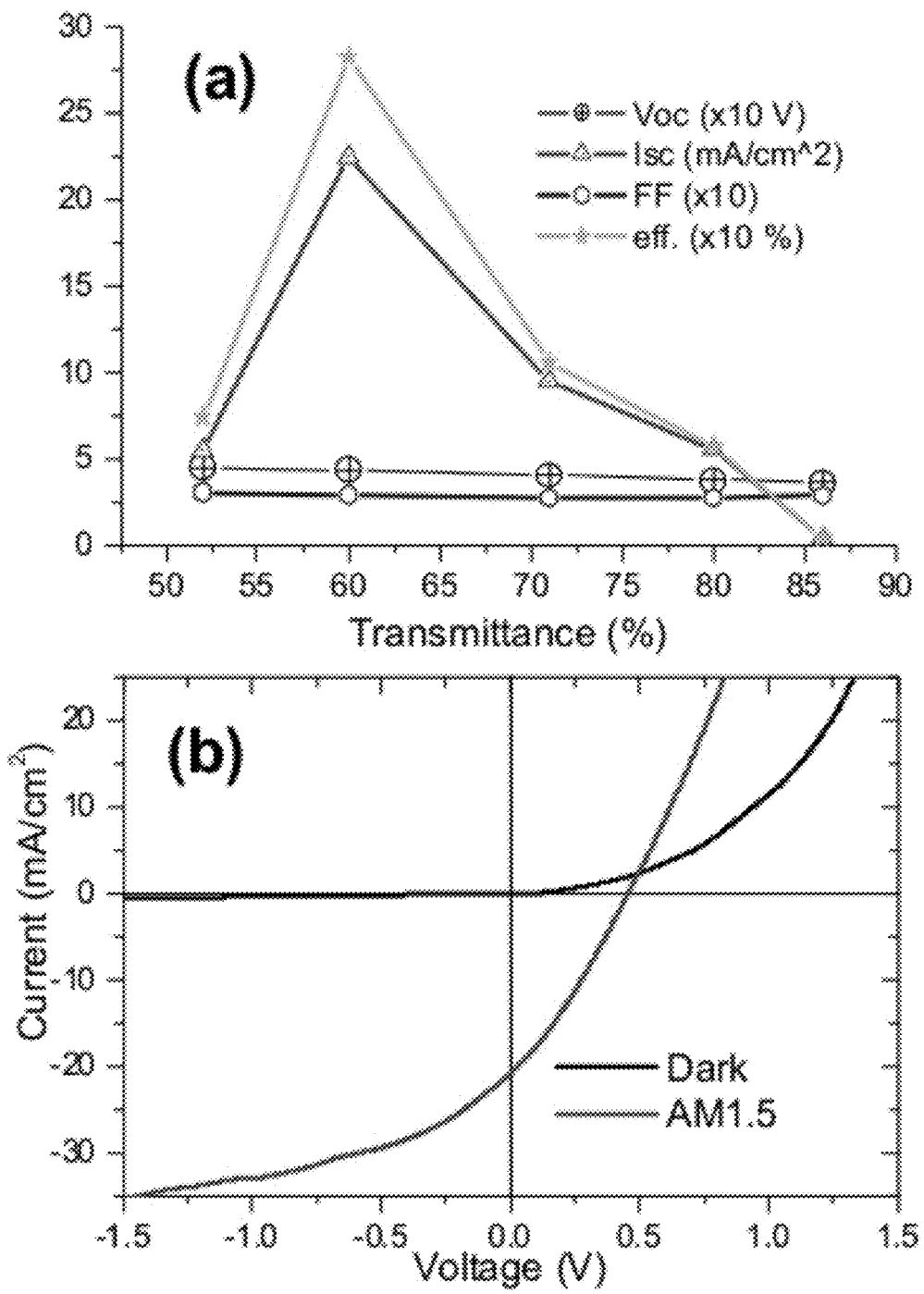
FIG. 3 shows characterization of a device formed according to one embodiment of the present invention: (a) summary of short-circuit current ($J_{sc}$), open-circuit voltage ($V_{oc}$), fill factor (FF), and efficiency ($\eta$) for SWNT cells with different thickness, showing maximum current and efficiency of the device with transmittance of about 60%; and (b) current-voltage plot of a typical SWNT/n-Si device in dark and under illumination, showing typical solar cell performance with efficiency of 2.7% according to one embodiment of the present invention.
Figure 4:
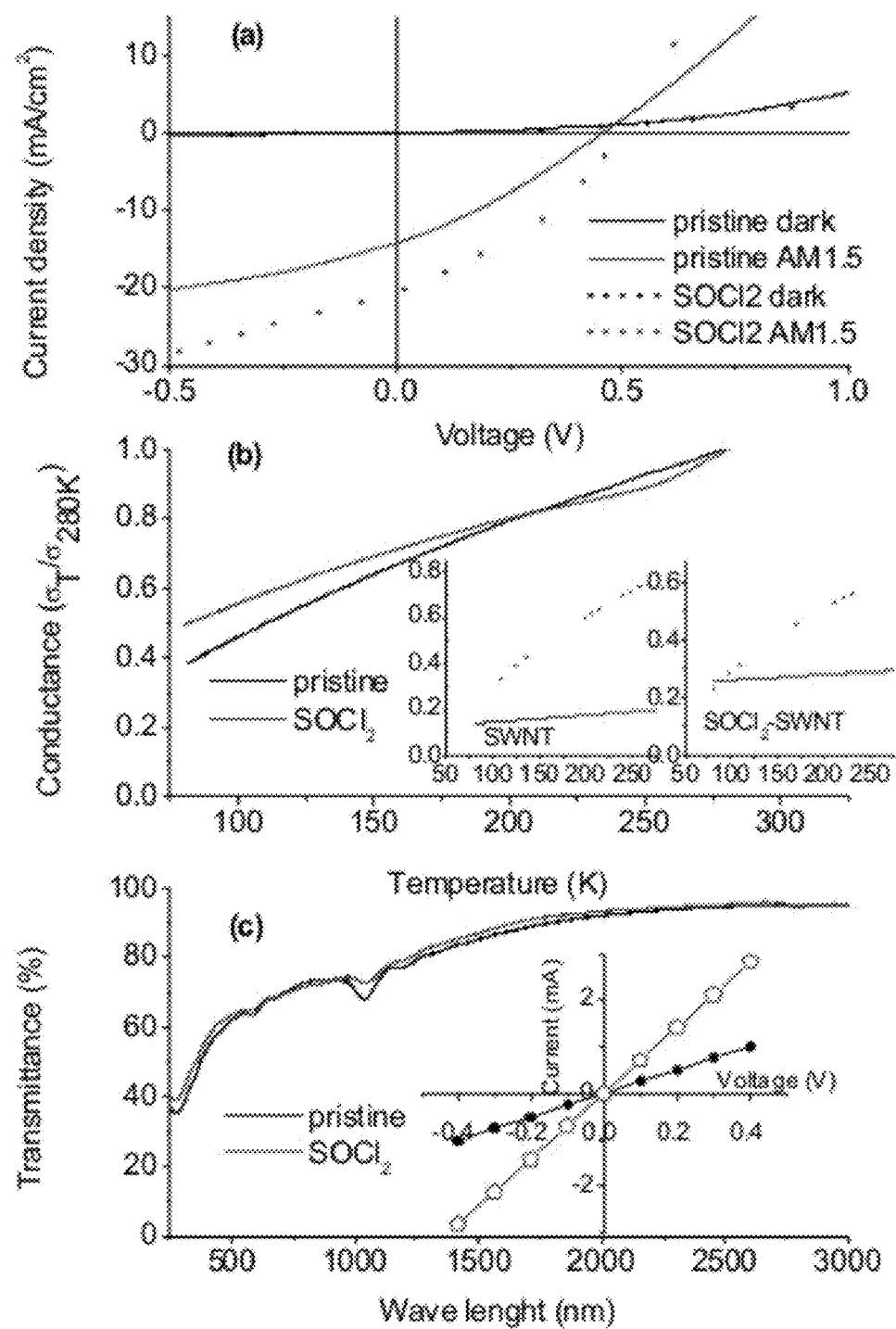
FIG. 4 shows: (a) the effect of the thionyl chloride ($SOCl_2$) treatment on the photovoltaic effect of SWNT/n-Si heterogeneous junctions. Chemical modification by $SOCl_2$ of the SWNT coating films was found to significantly increase the conversion efficiency by about 50% through adjusting the Fermi level and increasing the carrier concentration and mobility; (b) normalized temperature dependent conductances of transparent carbon nanotube networks. The inset displays the three conductance contributions: variable range hopping (blue dash) and fluctuation-assisted tunneling (red solid); and (c) effect of $SOCl_2$-treatment on the electron transportability and optical properties of an SWNT film according to one embodiment of the present invention.

Effect of SWNT coating thickness on photovoltaic performance. The morphology of these coatings or films of SWNTs can be described as a randomly distributed network of SWNTs with a high density of void spaces. SEM characterization reveals that a porous network structure of the airbrushed SWNT film is virtually free of catalyst residue or amorphous carbon particles, as shown in FIG. 2(a). The SWNTs lying on the substrate surface form numerous heterojunctions in contact with the underlying n-Si of the substrate 102. The networks of SWNTs form agglomerates of nanotube bundles containing many well-aligned tubes alternating with empty regions. Therefore, it may be difficult to define the thickness of these networks. Optical transmission was chosen as an appropriate method of averaging the structural irregularities and characterizing the thickness of various thin SWNT networks prepared on a glass substrate, using a Shimadzu double beam spectrophotometer UV-3600 with three detectors, in the range of wavelengths from 3300 to 200 nm. The transmittance values at wavelength of 550 nm measured on five transparent networks are given in the inset of FIG. 2(b). The film thickness can be further controlled to reach hundreds of nanometers by using different number of airbrushing strokes. Such semitransparency ensures the absorption of the solar light by both the SWNT film and the underlying Si wafer. SWNT samples made according to various embodiments of the present invention are a complex of conductive and semiconductive type of CNTs. Four-probe measurements for the SWNT films show that sheet resistance varies from 250 to 3900 Ω/sq for SWNT films with transmittance of 51-86% at wave length of 550 nm. Thus, SWNT films made according to various embodiments of the present invention can be directly used as a transparent conductive layer for solar cells, which can simplify the fabricating process of the CNT solar cell.

The flexibility of the fabrication process according to various embodiments of the present invention allows the construction cell devices containing SWNT films with different thickness by controlling the airbrushing process. Cells with tailored SWNT film thicknesses roughly ranging from 30 to about 270 nm (corresponding to 86-51% transmittance) were made according to various embodiments of the present invention. All the cells show relatively stable voltages (Voc) ranging from 0.37 to 0.45 V, but quite different current densities (Jsc), as shown in FIG. 3(a). The cell with transmittance of ~60% shows the highest Jsc (21.8 mA/cm$^2$) and η (2.7%). With further increased film thickness, the values of Jsc and η decrease significantly. Higher SWNT film thickness increases both the density of SWNTs and the total area of SWNT-Si junctions in the device, which could enhance the current generation/transport. However, at below 60% transmittance (thicker film), the SWNTs at top layers are suspending on the underneath layers and cannot touch the Si substrate to form junctions. Also, thicker films are less transparent, preventing more incident light from reaching the substrate. It thus showed that an optimal thickness of SWNT films of about 60% transmittance, with maximum current density and efficiency, was achieved according to various embodiments of the present invention.

In FIG. 3(b), the current-voltage characteristics of a typical SWNT/n-Si solar cell, such as photovoltaic device 100, made according to one embodiment of the present invention are shown, in which the SWNT film has about 60% transmittance (at 550 nm), in dark and under white light illumination (AM1.5, about 100 mW/cm$^2$). The device shows an evident p-n junction behavior in the dark, where the reversed current density is very low (about 30 μA/cm$^2$, over 400 times lower than the forward current density) when the bias voltage sweeps from −1.0 to 0 V compared to forward current (about 13 mA/cm$^2$ at 1.0 V) as shown in FIG. 3(b). Under illumination, the I-V curve shifts downward, with an open-circuit voltage Voc and short-circuit current density Jsc of about 0.5 V and 21.8 mA/cm$^2$, respectively. While the value of Voc is comparable to previous reports based on P3HT-SWNT composite structures, the Jsc of this SWNT/n-Si solar cell without polymer (P3HT) addition has been enhanced over 60 times more than that of the composite cells (0.34 mA/cm$^2$). The fill factor (FF) and power efficiency (η) of the SWNT/n-Si solar cell are about 29% and 2.7%, respectively, as shown in FIG. 3(a). Compared with previous solar cell configurations based on conjugated polymers mixed with SWNTs or double-walled nanotubes (FF about 15-30%, and η about 1%), devices according to various embodiments of the present invention show a fill factor in similar range but much higher efficiency. And devices made according to various embodiments of the present invention have the potential to be further optimized, for example, by tailoring the density and thickness of SWNT films, the bundle size (dispersion) and the semiconducting to metallic tubes ratio of SWNTs, so that power conversion efficiency can be further improved.

The excellent photovoltaic performance of the SWNT solar cells originates from the creation of heterojunctions at the interface between the SWNT film and the n-Si substrate. SWNTs usually behave as p-type semiconductors (also see the following Hall Effect measurement), indicating that large amount of holes in SWNTs are available, consistent with early study on field effect transistors of carbon nanotubes. When fully expanded on a planar Si substrate, there will be numerous p-n junctions formed due to close contact between SWNTs and underlying n-Si. The I-V curve in the dark actually shows a typical diode behavior, further confirming the existence of p-n junction of this SWNTs-on-Si configuration, as shown in FIG. 3(b). When a bundle of nanotubes contacts with a macroscopic metal electrode to form a nanotube/metal heterojunction, evident photocurrent can be detected. The high Jsc of the solar cells made according to various embodiments of the present invention suggests that the presence of high density p-n junctions significantly enhanced the generation/transport of charge carriers from both SWNTs and silicon under light irradiation. Nanotubes act mainly as hole collectors and conductors in polymer/nanotube solar cells. In SWNT/n-Si devices made according to various embodiments of the present invention, SWNTs might have participated in the photogeneration process as well as charge transport, and their high mobility ensures much enhanced efficiency compared with polymer composite cell structures.

The dark current density at forward bias (V>Voc) is much lower than the value measured under solar light. It indicates that light irradiation causes increase in current at this voltage range, as shown in FIG. 3(b), consistent with previous observation on polymer/nanotube systems where optical excitation increases the current density at V>Voc, although in contrast to observed current reduction for double wall carbon nanotube (DWNT) bundles under optical excitation. The photo-induced current flows through DWNT bundles under irradiation at the visible region, and the current could be enhanced when light illuminates on the interface between the DWNTs and metal electrode. Given the much larger interfacial area created by a fully expanded film compared with a thick bundle where the DWNTs well within the bundle do not contact directly the metal electrodes, the photo-induced electrons are injected to n-type Si while holes are transported through p-type SWNTs more efficiently. With about 60% transmittance of the SWNT coating, the Jsc actually reaches 21.8 mA/cm$^2$ at AM1.5, much higher than that of the SWNT/metal junction. A Schottky junction made by a silver paste (to replace the SWNT film) on top of Si did produce some power conversion, but the current density is 2-3 orders of magnitude lower (about several μA/cm$^2$) than the SWNT/n-Si junction.

Example 4

Enhanced Photovoltaic effect by SOCl$_2$ functionization. The conductivity of semitransparent SWNT thin films can be improved by a unique yet simple post-deposition method via exposure to nitric acid and thionyl chloride according to one embodiment of the present invention. To enhance the performance of the solar cells, chemical doping was performed by using thionyl chloride (SOCl$_2$), a liquid organic solvent with remarkable reactivity toward the SWNTs surfaces. The SOCl$_2$ treatment involved dripping about 3 droplets of pure SOCl$_2$ onto the SWNT films followed by drying in air. The chemical attachments of functionals to the SWNTs are in the form of acyl chloride groups. In FIG. 4(a), it was demonstrated the effect of the SOCl$_2$-treatment on the photovoltaic and electrical properties of a SWNT/n-Si device. After the SOCl$_2$ treatment, the short circuit current was raised up to 20.2 mA/cm$^2$ from 15.2 mA/cm$^2$, and the open circuit voltage slightly increased to 0.484 V from 0.445 V, and the FF basically showed no change, as a consequence, the SOCl$_2$ post treatment leads to about 45% increase in power conversion.

The behavior of the dc conductivity at low temperatures, as shown in FIG. 4(b), is an important indicator of conduction mechanisms. Among other things, there are two major mechanisms responsible for the conductivity-temperature dependence of the CNT films: (1) fluctuation-assisted tunneling through barriers, with the order of magnitude of typical energies indicated by the value of k$_B$T$_b$ and extent of the decrease of conductivity at low temperatures is indicated by the ratio T$_s$/T$_b$; and (2) hopping between mesoscopic metallic islands of conducting tubes separated by insulating ones, following Mott's variable-range hopping law for disordered semiconductors. Accordingly, the temperature dependence of conductance can be expressed in the following form:

$$\sigma(T) = \sigma_t e^{-T_b/(T_s+T)} + \sigma_0 e^{-(T_0/T)^{1/2}}$$

where the geometrical factors σ$_t$ and σ$_0$ can be treated as constant. For the present cases T$_b$ and T$_0$ were taken as constants. As the principal mechanism of electrical conduction in the CNT networks, the variable-range hopping between CNTs, here SWNTs, is also more sensitive to the temperature change. The fluctuation-assisted tunneling is mainly responsible for the extremely weak temperature dependence of the disordered CNT network systems. Although the SWNT material might contain a small fraction of metallic nanotubes, both pristine and SOCl$_2$-treated SWNT networks show nonmetallic behavior, suggesting the presence of tunneling barriers at the intertube junctions, with much stronger suppression of electron tunneling in the case of pristine SWNT film. But for the films with medium thickness (like 60% transparency here), the variable-range hopping contributes more to the conductance than the thermal fluctuation-assisted tunneling does, as shown in the inset of FIG. 4(b). Above 250 K, a crossover behavior was observed in the SOCl$_2$-treated SWNT film. It can be explained with the interrupted metallic model in which carriers of quasi-1D conductors cannot circumvent defects or other barriers (like functional groups here). As temperature increases, thermal fluctuations assist the tunneling and increase the conductance. At higher temperatures, the usual decrease in conductivity due to scattering of carriers by photons may dominate the temperature dependence.

As a strong oxidizing agent, SOCl$_2$ exhibits remarkable electron-withdrawing ability when adsorbed onto the SWNT surface. The significant charge transfer induced by SOCl$_2$ could also enable Fermi level shifting into the van Hove singularity region of SWNTs, resulting in a substantial increase in the density of states near the Fermi level. Consequently, the measured conductivity of the SOCl$_2$-treated SWNT films significantly increased. Despite the significant modification in their electrical properties, the treatment with SOCl$_2$ also weaken the S$_{11}$ (S$_{22}$) interband transition between the first (second) pair of van Hove singularities of the semiconducting tubes. Additionally, the SOCl$_2$ modification could be responsible for the generation of small gap in the metallic SWNTs, which determines the far IR absorption band, as shown in FIG. 4(c). The transparency is considerably higher at energies below 1.1 eV (about 1,100 nm), which is where the optical transparency of traditional ITO degrades due to free-carrier absorption. High transparency at long wavelengths combined with high conductivity would be a beneficial property for the thin-film tandem solar cells. With this functioning technique, typical sheet conductance of the optimized films can be improved about 5-10 folds.

Example 5

Hall-effect measurements. Hall-effect measurements were performed at room temperature to determine the carrier densities and mobilities of these CNT, or SWNT, films formed according to various embodiments of the present invention. The concentration of the carriers is given in terms of the sheet number N$_{2D}$ (cm$^{-2}$). After the SOCl$_2$-treatment, the carrier densities for the CNT film increased from about 3.1×10$^{15}$ to about 4.6×10$^{17}$ cm$^{-2}$, a jump of two orders. The effective mobilities for the SWNT, SOCl$_2$-SWNT films and n-Si are 2.1, 17.2, and 1026 cm$^2$ V$^{-1}$s$^{-1}$, respectively. Interestingly, the SOCl$_2$ treatment can also significantly enhance the SWNT mobility. The low mobility of the SWNT network could be caused by several factors including high resistivity between SWNT bundles and Schottky barriers between semiconducting and metallic nanotubes. The Hall effect measurements show that all CNT film samples show p-type conductivity. A standard oxidative purification process is known to induce p-type charge-transfer doping of the nanotubes, and SWNT networks have been observed to behave like p-type semiconductors in field effect transistors. Almost all transparent conducting oxides (like ITO) exhibit strong n-type behavior, and transparent p-type or hole-conducting contact would be desirable for applications such as thin film photovoltaic. The acid reflux-based purification procedures can often beneficially dope the p-type semiconducting tubes. This, along with doping from atmospheric impurities, is thought to influence the optoelectronic performances of the films. Transparent electrical CNT films are hole conducting, simple to deposit, flexible and low cost. Hence, they would be highly beneficial for the next generation of solar cells.

It is noted that while results disclosed herein are based on Si-based substrates according to various embodiments of the present invention, people skilled in the art can practice the present invention with other types of substrates using other semiconducting materials. Accordingly, the present invention provides an innovative yet simple way to fabricate semiconductor/nanotube hybrid devices, which may open the access to new technologies: SWNT/n-Si junctions formed according to various embodiments of the present invention can be applied as either diode components for high-frequency communication or photovoltaic devices for renewable energy technologies.

Low power efficiency and high production cost are the two major problems associated with solar cells that prevent their wide applications. Single wall carbon nanotubes (SWNTs)

bear a wide range of direct bandgaps matching the solar spectrum, and show strong photoabsorption, from infrared to ultraviolet, and exhibit high carrier mobility and reduced carrier transport scattering. These superior properties of SWNTs have also made them potential ideal candidate materials for highly active photovoltaic devices, which are made available for practicing the present invention. Among other things, according to various embodiments of the present invention, photovoltaic devices that operate on the heterojunctions between semiconductor and SWNTs are formed using a fabrication process that is novel yet simple, economic, environmentally benign, and applicable to fabricate device with large area. Despite of the simplicity of the fabrication process according to various embodiments of the present invention, the initial tests of the inventive photovoltaic devices have shown a power conversion efficiency of up to about 4.5%.

Thus, as set forth above, the inventive photovoltaic devices containing high dense SWNT/n-Si heterojunctions prepared with airbrushing technique show a strong rectifying behavior and photovoltaic effects when optically excited. The SWNTs in the cells are involved in multiple processes that are critical in improving the efficiency, including charge separation, transport, and collection. The numerous heterojunctions formed between p-SWNTs and n-Si perform just as the conventional p-n junctions in the generation of electron-hole pairs, which are then split and transported through SWNTs (holes) and n-Si (electrons), respectively. After the $SOCl_2$ treatment the major conduction mechanism of the SWNT coating network shifted from hopping towards tunneling. The $SOCl_2$-treatment of SWNT films also lead to significant increase in the conversion efficiency by adjusting the Fermi level and enhancing the carrier mobility of the SWNT coating. The larger carrier density and higher mobility of $SOCl_2$-treated SWNTs ensure more enhanced current density and power efficiency of solar cells compared with extensively studied polymer-nanotube composite structures. The photoconversion efficiency of the inventive photovoltaic devices can be further improved, for example, by optimizing the dispersion and thickness of the SWNT film, the n-doping level of the Si substrate, and the efficient electrode design for charge collection. The present invention, however, provides a complete and enabled process to fabricate n-type SWNT/p-type Si substrate based solar cells, even whole SWNT based (n-type SWNT/p-type SWNT) photovoltaic devices, among other things.

Accordingly, among other things, the present invention provides novel photovoltaic devices based on the heterojunctions between n-type semiconductor (Si) and carbon nanotubes, or SWNTs, and methods of forming them. In these novel photovoltaic devices, SWNTs were serving as both photogeneration sites and a charge carriers collecting/transport layer. The solar cells each have a semitransparent thin film of nanotubes conformally deposited on a n-type silicon or crystalline silicon substrate to create high-density p-n heterojunctions between nanotubes and n-Si to favor charge separation and extract electrons and holes. In exemplary embodiments, Si was selected because of its well-developed industrial applications and good electrical performance in solar cell. Other semiconductoring materials can also be utilized to practice the present invention. Furthermore, the post-treatment of SWNT coating film with thionyl chloride can considerably improve the photovoltaic properties of the heterogeneous junctions, and thus the performance of the novel photovoltaic devices.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

1. Zhongrui Li, Vasyl P. Kunets, Viney Saini, Yang Xu, Enkeleda Dervishi, Gregory J. Salamo, Alexandru R. Biris and Alexandru S. Biris, $SOCl_2$ *enhanced photovoltaic conversion of single wall carbon nanotube/n-silicon heterojunctions, Appl. Phys. Lett.* 93, (2008) 243117.
2. Avouris, P. *MRS Bull.* 2004, 29, 430.
3. Saito, R.; Dresselhaus, G.; Dresselhaus, M. S. *Physical Properties of Carbon Nanotubes*; Imperial College Press: London, 1998.
4. White, C. T.; Todorov, T. N. *Nature* 1998, 393, 240.
5. Javey, A.; Guo, J.; Wang, Q.; Lundstrom, M.; Dai, H. *Nature* 2003, 424, 654.
6. Ji Ung Lee, *Appl. Phys. Lett.* 2005, 87, 073101.
7. Pradhan, B.; Batabyal, S. K.; Pal, A. J. *Appl. Phys. Lett.* 2006, 88, 093106-093108.;
8. Ago, H.; Petritsch, K.; Shaffer, M. S. P.; Windle, A. H.; Friend, R. H. *AdV. Mater.* 1999, 11, 1281-1285.
9. Kymakis, E.; Amaratunga, G. A. J. *Appl. Phys. Lett.* 2002, 80, 112-114.
10. Pradhan, B.; Batabyal, S. K.; Pal, A. J. *Appl. Phys. Lett.* 2006, 88, 093106-093108.
11. Bhattacharyya, S.; Kymakis, E.; Amaratunga, G. A. J. *Chem. Mater.* 2004, 16, 4819-4823.
12. Kymakis, E.; Koudoumas, E.; Franghiadakis, I.; Amaratunga, G. A. J. J. *Phys. D: Appl. Phys.* 2006, 39, 1058-1062.
13. Miller, A. J.; Hatton, R. A.; Chen, G. Y.; Silva, S. R. P. *Appl. Phys. Lett.* 2007, 90, 023105-023107.
14. Alvarez, W. E.; Pompeo, F.; Herrera, J. E.; Balzano, L.; Resasco, D. E. *Chem. Mater.* 2002, 14, 1853-1858.
15. Richard, C.; Balavoine, F.; Schultz, P.; Ebbesen, T. W.; Mioskowski, C. *Science* 2003, 300, 775.
16. Somani, S. P.; Somani, P. R.; Umeno, M.; Flahaut, E. *Appl. Phys. Lett.* 2006, 89, 223505.
17. Pradhan, B.; Batabyal, S. K.; Pal, A. J. *Appl. Phys. Lett.* 2006, 88, 093106-093108.
18. Wei, J.; Jia Y.; Shu Q.; Gu Z.; Wang K.; Zhuang D.; Zhang G.; Wang Z.; Luo J.; Cao A.; Wu D. *Nano Letters* 2007, 7(8), 2317-21.
19. Shimada, T.; Sugai, T.; Ohno, Y.; Kishimoto, S.; Mizutani, T.; Yoshida, H.; Okazaki, T.; Shinohara, H. *Appl. Phys. Lett.* 2004, 84, 2412-2414.
20. Martel, R.; Schmidt, T.; Shea, H. R.; Hertel, T.; Avouris, P. *Appl. Phys. Lett.* 1998, 73, 2447-2449.
21. Sun, J. L.; Wei, J. Q.; Zhu, J. L.; Xu, D.; Liu, X.; Sun, H.; Wu, D. H.; Wu, N. L. *Appl. Phys. Lett.* 2006, 88, 131107-131109.
22. Pasquier, A. D.; Unalan, H. E.; Kanwal, A.; Miller, S.; Chhowalla, M. *Appl. Phys. Lett.* 2005, 87, 203511.

23. Pradhan, B.; Batabyal, S. K.; Pal, A. J. *Appl. Phys. Lett.* 2006, 88, 093106-093108.

24. Wei, J. Q.; Sun, J. L.; Zhu, J. L.; Wang, K. L.; Wang, Z. C.; Luo, J. B.; Wu, D. H.; Cao, A. Y. *Small* 2006, 2, 988-993.

25. Sun, J. L.; Wei, J. Q.; Zhu, J. L.; Xu, D.; Liu, X.; Sun, H.; Wu, D. H.; Wu, N. L. *Appl. Phys. Lett.* 2006, 88, 131107-131109.

26. Parekh, B. B.; Fanchini, G.; Γ Eda, G.; Chhowalla M. *Appl. Phys. Lett.* 2007, 90, 121913.

27. Sheng, P. *Phys. Rev. B* 1980, 21, 2180.

28. Ehinger, K.; Roth, S. *Philos. Mag. B* 1986, 53, 301.

29. Kaiser, A. B. *Rep. Prog. Phys.* 2001, 64, 1.

30. J. Hone, M. C. Llaguno, N. M. Nemes, A. T. Johnson, J. E. Fischer, D. A. Walters, M. J. Casavant, J. Schmidt, and R. E. Smalley, *Appl. Phys. Lett.* 2000, 77, 666.

31. G. Gruner, *J. Mater. Chem.* 2006, 16, 3533.

32. B. Kaiser, *Rep. Prog. Phys.* 2001, 64, 1.

33. B. Kaiser, *Adv. Mater.* (Weinheim, Ger.) 2001, 13, 927.

34. Coutts, T. J.; Ward, J. S.; Young, D. L.; Emery, K. A.; Gessert, T. A.; Noufi, R. *Prog. Photovoltaics* 2003, 11, 359.

35. Stadermann, M.; Papadakis, S. J.; Falvo, M. R.; Novak, J.; Snow, E.; Fu, Q.; Liu, J.; Fridman, Y.; Boland, J. J.; Superfine, R.; Washburn, S. *Phys. Rev. B* 2004, 69, 201402(R).

36. Bradley, K.; Gabriel, J. C. P.; Grüner, G. *Nano Lett.* 2003, 3, 1353.

37. Snow, E. S.; Novak, J. P.; Campbell, P. M.; Park, D. *Appl. Phys. Lett.* 2003, 82, 2145.

38. Coutts, T. J.; Ward, J. S.; Young, D. L.; Emery, K. A.; Gessert, T. A.; Noufi, R. *Prog. Photovoltaics* 2003, 11, 359.

39. van de Lagemaat, J.; Barnes, T. M.; Rumbles, G.; Shaheen, S. E.; Coutts, T. J.; Weeks, C.; Levitsky, I.; Peltola, J.; Glatkowski, P.; *Appl. Phys. Lett.* 2006, 88, 233503.

40. Skakalova, V.; Kaiser, A. B.; Dettlaff-Weglikowska, U.; Hrncarikova, K.; Roth, S. *J. Phys. Chem. B* 2005, 109, 7174.

41. Collins, P. G.; Bradley, K.; Ishigami, M.; Zettl, A. *Science* 2000, 287, 1801.

What is claimed is:

1. A method of forming a heterojunction structure, comprising the steps of:
    (a) preparing a silicon substrate; and
    (b) depositing a film on the silicon substrate, the film comprising a plurality of single wall carbon nanotubes, whereby forming a plurality of heterojunctions between the single wall carbon nanotubes and silicon by elevating temperature to about 150° C., such that no reaction occurs at each heterojunction to form SiC.

2. The method of claim 1, wherein the step of depositing comprises the steps of:
    (b1) preparing a solution of single wall carbon nanotubes dissolved in a solvent; and
    (b2) spraying the solution of single wall carbon nanotubes on the silicon substrate using a carrier gas.

3. The method of claim 2, wherein the carrier gas is dry air.

4. The method of claim 2, wherein the solvent is dimethylformamide (DMF).

5. The method of claim 2, further comprising the step of heating the silicon substrate and the film to an elevated temperature following the step of spraying to evaporate the solvent.

6. The method of claim 5, wherein the heating temperature is about 150° C.

7. The method of claim 2, further comprising the step of spraying the solution of single wall carbon nanotubes on the silicon substrate using a carrier gas at least one more time following the step of spraying to change the thickness of the film.

8. The method of claim 1, further comprising the step of treating the film of single wall carbon nanotubes with thionyl chloride ($SOCl_2$).

9. The method of claim 8, wherein the step of treating comprises the step of applying droplets of $SOCl_2$ onto the film of single wall carbon nanotubes.

10. The method of claim 1, wherein the plurality of single wall carbon nanotubes forms a randomly distributed porous network.

11. The method of claim 10, wherein the film of single wall carbon nanotubes has a thickness in the range between about 20 nm and 300 nm.

12. The method of claim 11, wherein the film of single wall carbon nanotubes has an optical transmittance in the range between about 45% and 90% for 550 nm wavelength light.

13. The method of claim 12, wherein the film of single wall carbon nanotubes has an optical transmittance of about 60% for 550 nm wavelength light.

14. The method of claim 1, wherein the substrate comprises n-type silicon.

15. The method of claim 1, wherein the substrate comprises p-type silicon.

16. The method of claim 1, wherein the substrate comprises crystalline silicon.

17. The method of claim 1, wherein the substrate comprises polycrystalline silicon in thin-film form.

18. An article of manufacture made by the method of claim 1.

19. A method of forming a heterojunction structure, comprising the steps of:
    (a) preparing a silicon substrate;
    (b) preparing a solution of single wall carbon nanotubes dissolved in a solvent;
    (c) spraying the solution of single wall carbon nanotubes on the silicon substrate to form a film of single wall carbon nanotubes; and
    (d) heating the silicon substrate and the film to an elevated temperature about 150° C. to evaporate the solvent such that a film is deposited on the silicon substrate, the film comprising a plurality of single wall carbon nanotubes, wherein a plurality of heterojunctions between the single wall carbon nanotubes and silicon is formed.

20. The method of forming a heterojunction structure, wherein the plurality of heterojunctions between the single wall carbon nanotubes and silicon is formed without reaction occuring at each heterojunction to form SiC.

* * * * *